United States Patent
Ahmed

(10) Patent No.: US 12,348,191 B2
(45) Date of Patent: Jul. 1, 2025

(54) COMBINER CIRCUIT FOR DOHERTY POWER AMPLIFIER AND RELATED METHOD OF OPERATION FOR ACHIEVING ENHANCED RADIO FREQUENCY AND VIDEO BANDWIDTH

(71) Applicant: NXP USA, Inc., Austin, TX (US)

(72) Inventor: Maruf Ahmed, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 646 days.

(21) Appl. No.: 17/720,109

(22) Filed: Apr. 13, 2022

(65) Prior Publication Data
US 2023/0336125 A1    Oct. 19, 2023

(51) Int. Cl.
*H03F 3/68* (2006.01)
*H01L 23/66* (2006.01)
(Continued)

(52) U.S. Cl.
CPC ........... *H03F 1/0288* (2013.01); *H01L 23/66* (2013.01); *H03F 3/195* (2013.01); *H03F 3/245* (2013.01);
(Continued)

(58) Field of Classification Search
CPC ........ H03F 1/0288; H03F 3/195; H03F 3/245; H03F 3/604; H03F 2200/451;
(Continued)

(56) References Cited

U.S. PATENT DOCUMENTS

| | | | |
|---|---|---|---|
| 7,078,976 B2 * | 7/2006 | Blednov | ................ H01L 24/49 330/53 |
| 8,228,123 B2 | 7/2012 | Blednov | |

(Continued)

FOREIGN PATENT DOCUMENTS

| | | |
|---|---|---|
| CN | 110417357 A | 11/2019 |
| CN | 111416578 A | 7/2020 |

(Continued)

OTHER PUBLICATIONS

Sakata et al., "A Fully Integrated CaN Doherty Power Amplifier Module with a Compact Frequency-Dependent Compensation Circuit for 5G Massive MIMO Base Stations," IEEE MTT-S Intl Microwave Symposium, pp. 711-714 (2020).

*Primary Examiner* — Khanh V Nguyen

(57) ABSTRACT

Doherty power amplifiers (DPAs), and related circuits, devices, systems and methods of operation, are disclosed herein. In an example embodiment, a system includes a first transistor device operable as a carrier amplifier, a second transistor device operable as a peaking amplifier, and at least one first integrated passive device (IPD) coupled between a combining node and each of carrier and peaking amplifier output ports. The system includes a first frequency-corrective network coupling the carrier amplifier output port with the node, where the network is formed at least in part by the at least one first IPD and is configured to operate as a first quasi-inverter network that includes a low-pass network. Additionally, the system includes a second frequency-corrective network coupling the peaking amplifier output port with the node, where the network is formed at least in part by the at least one first IPD and includes a bandpass network.

20 Claims, 6 Drawing Sheets

(51) Int. Cl.
*H03F 1/02* (2006.01)
*H03F 3/195* (2006.01)
*H03F 3/24* (2006.01)
*H03F 3/60* (2006.01)

(52) U.S. Cl.
CPC ...... *H03F 3/604* (2013.01); *H01L 2223/6611* (2013.01); *H01L 2223/6655* (2013.01); *H03F 2200/451* (2013.01)

(58) Field of Classification Search
CPC ......... H03F 2200/222; H03F 2200/387; H03F 1/565; H03F 3/211; H03F 3/602; H03F 3/68; H01L 23/66; H01L 2223/6611; H01L 2223/6655
USPC .............................................. 330/124 R, 295
See application file for complete search history.

(56) References Cited

U.S. PATENT DOCUMENTS

| | | | |
|---|---|---|---|
| 8,659,359 | B2 | 2/2014 | Ladhani et al. |
| 9,419,566 | B2 | 8/2016 | Noori et al. |
| 11,145,609 | B2 | 10/2021 | Schultz et al. |
| 2018/0175799 | A1 | 6/2018 | Wu et al. |
| 2019/0140598 | A1 | 5/2019 | Schultz et al. |
| 2023/0116432 | A1* | 4/2023 | Joshi ................ H03F 1/0288 330/291 |

FOREIGN PATENT DOCUMENTS

| | | |
|---|---|---|
| CN | 111510077 A | 8/2020 |
| CN | 107332518 B | 9/2020 |
| CN | 112491365 A | 3/2021 |
| EP | 3664287 A1 | 10/2020 |

* cited by examiner

US 12,348,191 B2

COMBINER CIRCUIT FOR DOHERTY POWER AMPLIFIER AND RELATED METHOD OF OPERATION FOR ACHIEVING ENHANCED RADIO FREQUENCY AND VIDEO BANDWIDTH

CROSS-REFERENCE TO RELATED APPLICATIONS

--

STATEMENT REGARDING FEDERALLY SPONSORED RESEARCH OR DEVELOPMENT

--

FIELD OF THE DISCLOSURE

The present disclosure relates to amplification systems and methods employed for wireless communications and, more particularly, to Doherty Power Amplifiers (DPAs) and related circuits, devices, systems, and methods of operation.

BACKGROUND OF THE DISCLOSURE

In conventional massive MIMO (multiple-input and multiple-output) based 5G base-stations, it is desirable to reduce the footprint of the Doherty power amplifiers (DPAs) that are employed in the transmission (Tx) path of the transceiver chain. Either full or partial integration of the DPA components within a power amplifier package may facilitate reduction of the DPA footprint.

Further, there is an increased demand to cover multiple bands using a single wideband DPA solution, and conventional Doherty architectures fall short of providing wide enough RF bandwidth to meet that demand. As an example, customers may be seeking a DPA solution that may cover both the B41 (CBRS) 3.4-3.6 gigahertz (GHz) band and the B42 (C-band) 3.6-3.8 GHz band. To fulfill this customer goal, a wideband integrated DPA solution should operate concurrently in these two RF bands. To be more specific, the DPA should possess saturated power, linear gain, and efficiency characteristics at back-off (8 dB or 8.5 dB) that are not frequency dispersive over a wide (e.g., 400 megahertz (MHz)) bandwidth. Current integrated Doherty solutions may fail to demonstrate this kind of flat performance across such a wide frequency bandwidth.

Therefore, for at least one or more of these reasons, or one or more other reasons, it would be advantageous if improved amplification systems and/or methods suitable for wireless communications applications and, more particularly, improved Doherty Power Amplifiers (DPAs) and associated circuits, devices, systems, or methods of operation, were developed so as to address any one or more of the concerns discussed above or to address one or more other concerns or provide one or more benefits.

DETAILED DESCRIPTION

One of the leading candidates for compact DPA solutions involves use of an "integrated Doherty" architecture in which carrier and peaking power transistors and the DPA combiner are "integrated" within a single power amplifier package. An integrated system having such an integrated Doherty architecture particularly may include a system in which one or more lumped component based C-L-C "quasi-inverters" are employed in place of a quarter-wave impedance inverter of a Doherty combiner having a distributed transmission line-based architecture.

An integrated Doherty combiner may be designed based upon a 90-0 topology. The quasi-inverter in such an integrated Doherty combiner absorbs drain-source capacitances using a C-L-C architecture, where a series inductor is connected in between the carrier and peaking drain manifolds so as to operate as a quarter-wave impedance inverter. The combining (or combiner) nodes on an integrated Doherty combiners may be located at the drain manifold of the peaking device or the carrier device, depending on whether the Doherty amplifier has a non-inverted or an inverted topology. In a module environment, the same idea is utilized except insofar as, instead of a lumped series inductor component (usually bond wire) being employed, a reduced insertion angle (<90°) microstrip transmission line is used in a high-k dielectric printed circuit board (PCB) material.

Figure 1:
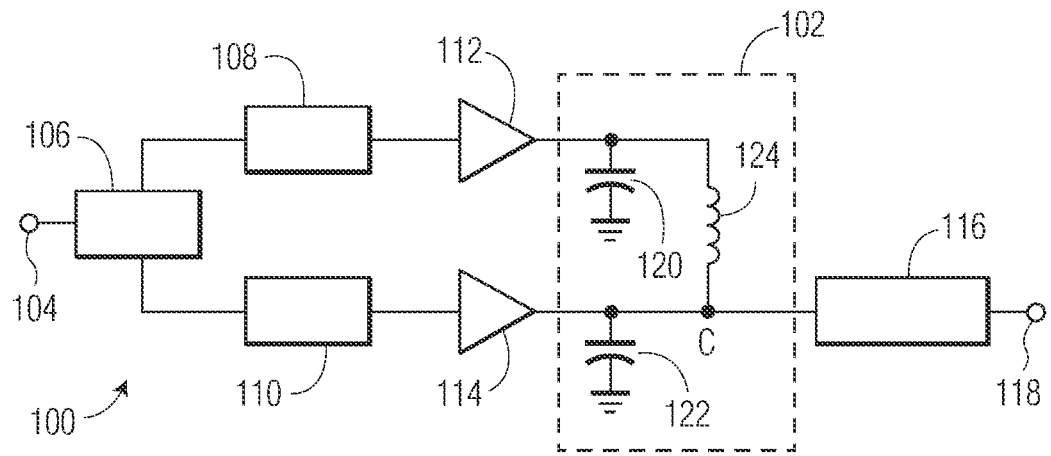
FIG. 1 is a schematic diagram of an example of an integrated Doherty power amplifier (DPA)

More particularly in this regard, FIG. 1 illustrates an example integrated DPA (or DPA circuit) 100 having a configuration that includes a C-L-C quasi-inverter 102. As shown, the DPA 100 includes (in addition to the C-L-C quasi-inverter 102) an input terminal 104, a splitter 106, first and second input matching networks (IMNs) 108 and 110, a carrier amplifier 112, a peaking amplifier 114, an impedance transformer 116, and a RF output terminal 118. The splitter 106 is coupled between the input terminal 104 and each of the first and second IMNs 108 and 110. The first IMN 108 is coupled between the splitter 106 and an input port of the carrier amplifier 112, and the second IMN 110 is coupled between the splitter and an input port of the peaking amplifier 114. The first IMN 108 may introduce a first phase differential between the splitter and the input port of the carrier amplifier 112, and the second IMN 110 may introduce a second phase differential (e.g., different from the first phase differential by a phase amount φ) between the splitter and the input port of the peaking amplifier 114.

The C-L-C quasi-inverter 102 is coupled between the output ports of each of the carrier and peaking amplifiers 112 and 114, and the impedance transformer 116, which in turn is coupled between the C-L-C quasi-inverter 102 and the RF output terminal 118. With respect to the internal components of the C-L-C quasi-inverter 102 in particular, FIG. 1 shows that the C-L-C quasi-inverter includes a first parasitic drain-source capacitance 120 having a capacitance $C_{ds,c}$ and coupled between the output port of the carrier amplifier 112 and ground, a second parasitic drain-source capacitance 122 having a capacitance $C_{ds,p}$ and coupled between the output port of the peaking amplifier 114 and ground, and an inductance 124 having an inductance L and coupled between the output port of the carrier amplifier 112 and a combining node C, which is directly coupled to each of the output port of the peaking amplifier 114 and an input port of the impedance transformer 116 (the output of which constitutes the RF output terminal 118).

Figure 2:
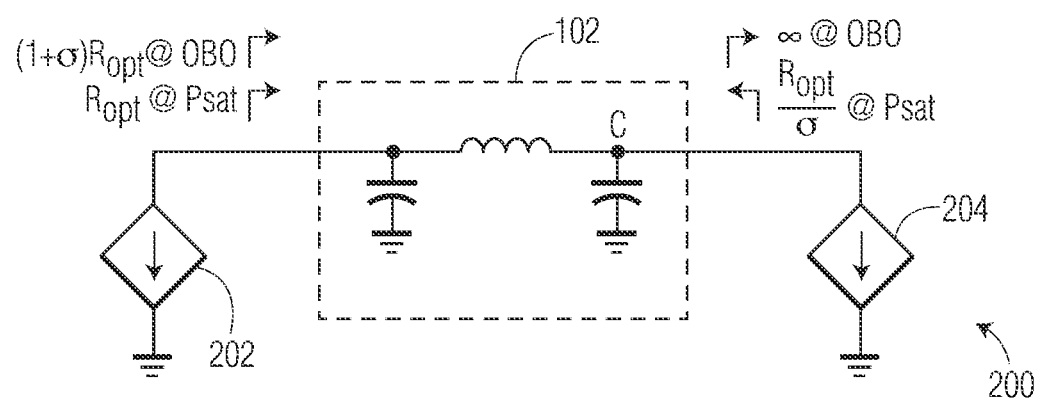
FIG. 2 is a schematic diagram of the integrated DPA of FIG. 1, in which interaction of a C-L-C quasi-inverter with other portions of the DPA is illustrated by current source models.

The quasi-inverter configuration illustrated by FIG. 1 is used in a symmetric two-way DPA. FIG. 2 depicts the DPA 100 in a schematic representation 200 showing the C-L-C quasi-inverter 102 coupled to each of a first current source 202 representative of current ($I_c$) flowing relative to the carrier amplifier 112 and a second current source 204 representative of current ($I_p$) flowing relative to the peaking amplifier 114. In this example representation, it is assumed that the respective output currents of the carrier amplifier 112 and peaking amplifier 114 are identical ($I_p=I_c$), and also that the capacitances of the first capacitance 120 and second capacitance 122 are equal ($C_{ds,c}=C_{ds,p}$), and further that an asymmetry ratio equals one (σ=1). FIG. 2 particularly illustrates that the optimum characteristic impedance of the C-L-C quasi-inverter 102 should be $R_{opt}$ with an insertion angle of 90 degrees to present the optimum load conditions at output back-off (OBO) and saturation conditions. The combining node C particularly is located at the peaking drain manifold (so as to be directly coupled to the output port of the peaking amplifier 114). The impedance at the combining node C should also satisfy the $R_{opt}/(1+σ)$ condition for optimum Doherty operation. Hence, the combining node impedance is a direct function of $R_{opt}$ and the asymmetry ratio, a, for these Doherty combiners.

In the case of asymmetric integrated Doherty designs, as the drain-source capacitances, $C_{ds,c}$ and $C_{ds,p}$, are not equal, more advanced C-L-C configurations are appropriate to present optimum Doherty load conditions to the current generators. In one configuration suitable for use in module products, the inductance 124 (with series inductance L) may be replaced by a combination of series inductors (having respective inductance values $L_x$ and $L_y$) and a microstrip-transmission line (having impedance characteristics $Z_L$, θ). It should be noted that, in such configurations, the combining node C is still located at the drain manifold of the peaking amplifier and the characteristic impedance of the quasi-inverter and the load presented to the current generators at OBO and saturation are the same general expressions shown in FIG. 2 (except now $I_p>I_c$, $C_{ds,p}>C_{ds,c}$ and σ>1).

Although a distributed transmission line-based architecture may be replaced by a lumped component-based solution as described above in regard to FIGS. 1 and 2, such a modification may be disadvantageous in that it may entail limited RF (radio frequency) bandwidth. In such Doherty combiner configurations, there may be little flexibility on the choice of combining node impedance and the characteristic impedance of the quasi-inverter. Consequently, even though the above-described quasi-inverter offers a well-defined and compact solution for a broad range of frequency and power for DPA products, such quasi-inverters may be inherently narrowband in nature, and typically are good for 5-7% fractional RF bandwidth. In particular, the bandwidth may heavily suffer in such integrated DPAs employing C-L-C quasi-inverters if the power level goes up during operation of a DPA. The potential result of this is a high impedance transfer ratio (ITR) at OBO condition as the asymmetry ratio σ goes up and relatively narrow bandwidth. Further, if the drain-source-capacitance values are not optimal (or optimum), the capacitance values may be either resonated out by shunting operation of the inductor (if capacitances are too high) or extra capacitances may be added (if capacitances are too low).

The present disclosure relates to improved DPAs having an improved integrated Doherty combiner architecture that may achieve significant performance improvements relative to conventional DPAs. In particular, such an improved DPA having such an improved integrated Doherty architecture may achieve significant bandwidth improvements by comparison with conventional DPAs, both in terms of radio frequency (RF) bandwidth and also in terms of instantaneous bandwidth/video bandwidth (VBW) of the DPA. The improved integrated Doherty combiner architecture has a topology that is compact and may be integrated inside a package, while potentially improving the RF bandwidth two to three times by comparison with a conventional combiner.

In regard to the improved integrated Doherty combiner architecture described below, the present inventor has recognized that there are two major reasons why conventional quasi-inverters may suffer from narrow RF bandwidth, namely, a first reason relating to the impedance transformation ratio of such conventional quasi-inverters, and a second reason relating to the lack of a frequency corrective network at the peaking output of such conventional quasi-inverters.

More particularly, for a conventional C-L-C inverter, there is no impedance transformation from the intrinsic current-generator plane of the carrier to the combining node (located at the peaking manifold) at the high power region. The characteristic impedance of such a conventional C-L-C inverter is generally chosen to be $R_{opt}$ for achieving a maximum power utilization factor (PUF). With this characteristic impedance choice, at the low power region, the impedance transfer ratio (ITR) becomes $(1+σ)R_{opt}:R_{opt}/σ$, or σ(1+σ): 1, where σ is the peaking-to-carrier power ratio (or asymmetry ratio). For example, for a symmetric DPA, as σ=1, ITR is 2:1. Also, in the case of an asymmetric DPA, if σ is chosen to be 2, ITR becomes 6:1. Bandwidth is inversely proportional to ITR. Therefore, as a high asymmetry ratio is chosen to achieve high back-off (BO) efficiency for high peak-to-average power ratio (PAPR) signals, bandwidth is degraded by conventional C-L-C inverters, which may result in relatively highly dispersive BO efficiency.

Second, in conventional CLC inverters, there is no impedance transformation from the intrinsic current generator plane of the peaking amplifier to the combining node, as the combining node is located at the drain manifold of the peaking amplifier itself. The absence of any impedance transformation network at the peaking output that may be designed to work as a frequency corrective network also may be responsible for relatively-narrow RF bandwidth in conventional CLC inverters.

In contrast to such conventional CLC inverters, the present disclosure envisions an improved integrated Doherty combiner architecture that offers more flexibility for the combining node impedance choice by moving the combining node to an integrated passive device (IPD), which is physically separate from the peaking drain manifold. Additionally, the improved integrated Doherty combiner architecture provides a frequency corrective network for improved bandwidth. Further, in at least some embodiments, the improved integrated Doherty combiner architecture is compact, and may be integrable inside a package using bond wires and IPDs. Additionally, in at least some embodiments, the improved integrated Doherty combiner architecture may be implemented using high Q bond wires, MIM-Caps (metal-insulator-metal capacitors) and other types of capacitors, so as to achieve low-loss operation. Further, in addition to encompassing embodiments involving an integrated Doherty approach (e.g., to achieve enhanced bandwidth performance by comparison with conventional CLC inverters), the present disclosure also encompasses embodiments suitable for a module environment.

Figure 3:
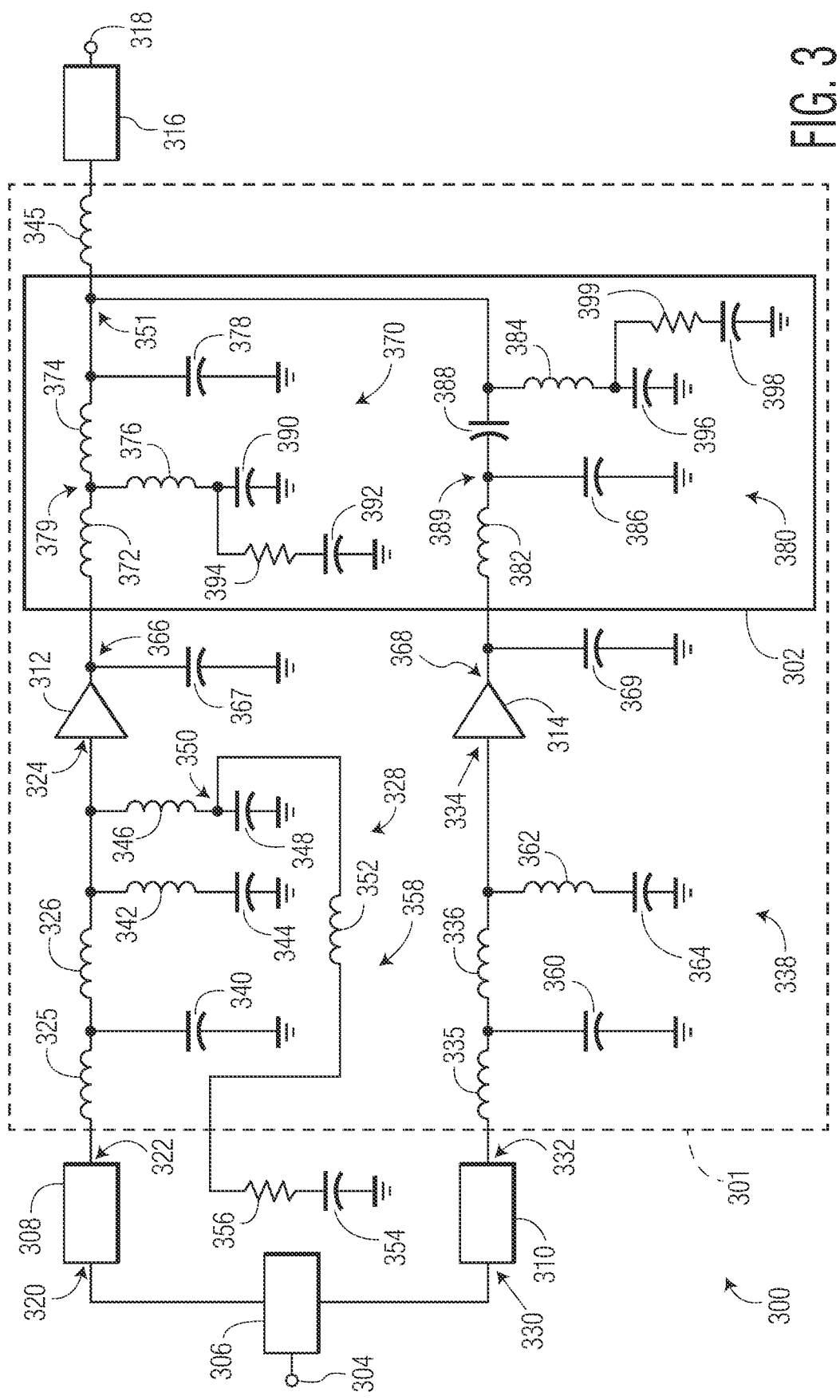
FIG. 3 is a schematic diagram of an improved integrated Doherty power amplifier (DPA) in accordance with one example embodiment encompassed herein.

Referring to FIG. 3, an example integrated DPA (or DPA circuit) 300 having an improved Doherty combiner circuit (shown within a dashed box) 302 in accordance with an example embodiment encompassed herein is shown in schematic form. As shown, the DPA 300 includes (in addition to the Doherty combiner circuit 302) a RF input terminal 304, a splitter 306, first and second input matching networks (IMNs) 308 and 310, a carrier amplifier 312, a peaking amplifier 314, an impedance transformer 316, and a RF output port 318.

The splitter 306 is coupled between the input terminal 304 and each of the first and second IMNs 308 and 310. The first IMN 308 has a first input port 320 that is coupled to the splitter 306 and a first output port 322 that is coupled to a carrier input port 324 of the carrier amplifier 112 by way of a first inductor 325 and a second inductor 326 (having an inductance $L_{inserc}$) of a first intermediate circuit 328, where the first and second inductors 325, 326 are coupled in series between the first output port 322 and the carrier input port 324. The second IMN 310 has a second input port 330 that is coupled to the splitter 306 and a second output port 332 that is coupled to a peaking input port 334 of the peaking amplifier 314 by way of a third inductor 335 and a fourth inductor 336 (having an inductance $L_{inserp}$) of a second intermediate circuit 338, where the third and fourth inductors 335, 336 are coupled in series between the second output port 332 and the peaking input port 334. The first IMN 308 may introduce a first phase differential between the splitter 306 and the carrier input port 324, and the second IMN 310 may introduce a second phase differential (e.g., different from the first phase differential by a phase amount ($\Phi$)) between the splitter and the peaking input port 334.

Additionally as shown, the first intermediate circuit 328 includes, in addition to the first and second inductors 325, 326, several additional components. In particular, a first additional capacitor 340 (having a capacitance $C_{inc}$) is coupled to a node between the first and second inductors 325, 326 (and thus one terminal of each of the first and second inductors 325, 326) and ground. The first and second inductors 325, 326 and the first additional capacitor 340 are configured as an in-package portion of the carrier input impedance matching network. Also, a first harmonic termination circuit comprising a first additional inductor 342 (having an inductance $L_{2f0}$) and a second additional capacitor 344 (having a capacitance $C_{2f0}$) are series coupled between the carrier input port 324 (and thus the other terminal of the first inductor 326) and ground, with the first additional inductor 342 being coupled between the carrier input port 324 and the second additional capacitor, and the second additional capacitor being coupled between the first additional inductor and ground. Further, a second additional inductor 346 (having an inductance $L_{inshc}$) and a third additional capacitor 348 (a DC blocking capacitor having a capacitance $C_{block}$) are also series coupled between the carrier input port 324 (and thus the other terminal of the second inductor 326) and ground, with the second additional inductor 346 being coupled between the carrier input port 324 and the third additional capacitor 348, and the third additional capacitor 348 being coupled between the second additional inductor 346 and ground. Thus, it will be appreciated that the inductor 342 and capacitor 344 are coupled in parallel relative to the inductor 346 and capacitor 348, between the carrier input port 324 and ground.

Further, a node 350 (e.g., an RF cold point node) linking the second additional inductor 346 and third additional capacitor 348 is coupled to ground by way of a video bandwidth (VBW) circuit that includes a third additional inductor 352 (having an inductance $L_{env}$), a fourth additional capacitor 354 (having a capacitance $C_{env}$), and a first resistor 356 (having a resistance $R_{env}$). In the present example embodiment, the first resistor 356 is coupled between the third additional inductor 352 and the fourth additional capacitor 354, the third additional inductor is coupled between the node 350 and the first resistor, and the fourth additional capacitor is coupled between the first resistor and ground. The inductor 352, capacitor 354, and resistor 356 may be considered an input circuit portion 358 of an enhanced VBW network described in further detail below.

Further as shown, the second intermediate circuit 338 includes, in addition to the third and fourth inductors 335, 336, several additional components. In particular, a first further capacitor 360 (having a capacitance $C_{inp}$) is coupled to a node between the third and fourth inductors 335, 336 (and thus one terminal of each of the third and fourth inductors 335, 336) and ground. The third and fourth inductors 335, 336 and the first further capacitor 360 are configured as an in-package portion of the peaking input impedance matching network. Also, a first further inductor 362 (having an inductance $L_{inshp}$) and a second further capacitor 364 (a DC blocking capacitor having a capacitance $C_{block}$) are also series coupled between the peaking input port 334 (and thus the other terminal of the second inductor 336) and ground, with the first further inductor 362 being coupled between the peaking input port 334 and the second further capacitor, and the second further capacitor being coupled between the first further inductor and ground.

Each of the carrier and peaking amplifiers 312, 314 includes one or more semiconductor die (e.g., dies 712, 714, FIG. 7) with one or more integrated field effect transistors (FETs). According to an embodiment, each of the FETs (e.g., FETs within dies 712, 714, FIG. 7) may be a III-V field effect transistor (e.g., a high electron mobility transistor (HEMT)), which has a nonlinear input capacitance and a relatively low drain terminal-source terminal capacitance, Cds, when compared with a silicon-based FET (e.g., a laterally-diffused metal oxide semiconductor (LDMOS) FET). According to an embodiment, each of the FETs within amplifiers 312, 314 (and dies 712, 714) may have a drain terminal-source terminal capacitance that is less than about 0.2 picofarads per watt (pF/W). Further, in some embodiments, each of the FETs within amplifiers 312, 314 may be a gallium nitride (GaN) FET, although in other embodiments, each of the FETs within amplifiers 312, 314 may be another type of III-V transistor (e.g., gallium arsenide (GaAs), gallium phosphide (GaP), indium phosphide (InP), or indium antimonide (InSb)), or another type of transistor. The implementation of GaN FETs in some embodiments may be advantageous for one or more reasons, such as that each of the GaN FETs may have a relatively low drain-to-source capacitance. In still other embodiments, each of the FETs within amplifiers 312, 314 may be an LDMOS FET, or another type of FET.

Additionally as shown in FIG. 3, each of a carrier output port 366 and a peaking output port 368 of the DPA 300 are coupled to the impedance transformer 316 by way of the improved Doherty combiner circuit 302, which in turn links each of those output ports to the RF output port 318. In the present example embodiment, the improved Doherty combiner circuit 302 includes a first circuit portion 370 coupling the carrier output port 366 with the impedance transformer 316, and a second circuit portion 380 coupling the peaking output port 368 with the impedance transformer. Further, although not provided by discrete circuit components, a first parasitic capacitance 367 (having a capacitance $C_{ds,c}$) also is present between the carrier output port 366 and ground, and a second parasitic capacitance 369 (having a capacitance $C_{ds,p}$) also is present between the peaking output port 368 and ground.

More particularly with respect to the first circuit portion 370, that circuit portion includes a plurality of components, namely, a first combiner inductor 372 (having an inductance $L_{1c}$), a second combiner inductor 374 (having an inductance $L_{1c}$), a third combiner inductor 376 (having an inductance $L_{2c}$), a first combiner capacitor 378 (having a capacitance $C_{1c}$), a second combiner capacitor 390 (e.g., a DC blocking capacitor having a capacitance $C_{block}$), a third combiner capacitor 392 (having a capacitance $C_{env}$), and a first combiner resistor 394 (having a resistance $R_{env}$). As shown, the first and second combiner inductors 372 and 374 are coupled in series between the carrier output port 366 and the impedance transformer 316, with the first combiner inductor being coupled between the carrier output port and a first intermediate node 379 and the second combiner inductor being coupled between the first intermediate node and a combining (or combiner) node 351 (C). The combining node 351 constitutes the output node of the combiner circuit 302, at which RF output signals are provided from the combiner circuit. An additional inductor 345 is coupled between the combining node 351 and the input terminal of the impedance transformer 316.

Further, the first combiner capacitor 378 is coupled between ground and the combining node 351. Additionally, the third combiner inductor 376 is additionally coupled between the first intermediate node 379 and each of the second combiner capacitor 390 and the first combiner resistor 394. The second combiner capacitor 390 in turn is coupled between the third combiner inductor 376 and ground, and the third combiner capacitor 392 is coupled between the first combiner resistor 394 and ground, with the first combiner resistor linking the third combiner capacitor 392 to the third combiner inductor 376. Thus, the second combiner capacitor 390 is coupled in parallel, between the third combiner inductor 376 and ground, with the series combination of the first combiner resistor 394 and the third combiner capacitor 392. It should be appreciated that, when the DPA 300 is driven by a modulated signal, the third combiner capacitor 392 terminates the envelope frequency of the modulated signal to a low magnitude impedance. Further, the first combiner resistor 394 reduces the quality factor (Q) of the VBW network to further attenuate the magnitude of the envelop frequency impedance. The combined action of these two components (the third combiner capacitor 392 and first combiner resistor 394) improves the VBW of the DPA.

As for the second circuit portion 380, that circuit portion also includes a plurality of components, namely, a fourth combiner inductor 382 (having an inductance $L_{1p}$), a fifth combiner inductor 384 (having an inductance $L_{2p}$), a fourth combiner capacitor 386 (having a capacitance $C_{1p}$), a fifth combiner capacitor 388 (having a capacitance $C_{2p}$), a sixth combiner capacitor 396 (e.g., a DC blocking capacitor having a capacitance $C_{block}$), a seventh combiner capacitor 398 (having a capacitor $C_{env}$), and a second combiner resistor 399 (having a resistance $R_{env}$). As shown, the fourth combiner inductor 382 and fifth combiner capacitor 388 are coupled in series between the peaking output port 368 and the combining node 351, with the fourth combiner inductor being coupled between the peaking output port and a second intermediate node 389, and the fifth combiner capacitor being coupled between the second intermediate node and the combining node 351.

Further, the fourth combiner capacitor 386 is coupled between ground and the second intermediate node 389. Additionally, the fifth combiner inductor 384 is additionally coupled to the combining node 351 and to each of the sixth combiner capacitor 396 and the second combiner resistor 399. The sixth combiner capacitor 396 in turn is coupled between the fifth combiner inductor 384 and ground, and the seventh combiner capacitor 398 is coupled between the second combiner resistor 399 and ground, with the second combiner resistor 399 linking the seventh combiner capacitor 398 to the fifth combiner inductor 384. Thus, the sixth combiner capacitor 396 is coupled in parallel, between the fifth combiner inductor 384 and ground, with the series combination of the second combiner resistor 399 and the seventh combiner capacitor 398. It should be appreciated that, when the DPA 300 is driven by a modulated signal, the seventh combiner capacitor 398 terminates the envelope frequency of the modulated signal to a low magnitude impedance. Further, the second combiner resistor 399 reduces the quality factor (Q) of the VBW network to further attenuate the magnitude of the envelop frequency impedance. The combined action of these two components (the seventh combiner capacitor 398 and second combiner resistor 399) improves the VBW of the DPA.

It should be appreciated that, depending upon the embodiment, different circuit components of the DPA 300 may be implemented inside or as portions of a semiconductor package. In the present example embodiment in particular, all of the components included within a dashed box 301 are inside the semiconductor package (e.g., semiconductor package 702, FIG. 7). The components include all of the components of the improved Doherty combiner circuit 302, the carrier amplifier 312, the peaking amplifier 314, and the first and second intermediate circuits 328 and 338, excepting the first resistor 356 and fourth additional capacitor 354, which are implemented outside the semiconductor package, in the illustrated embodiment. In other embodiments, the first resistor 356 and the fourth additional capacitor 354 may be implemented inside the semiconductor package (e.g., within IPD 726, FIG. 7). The first output port 322 and second output port 332 may respectively be considered to constitute first and second input ports, respectively, for the circuitry provided in the semiconductor package within the dashed box 301.

Figure 4:
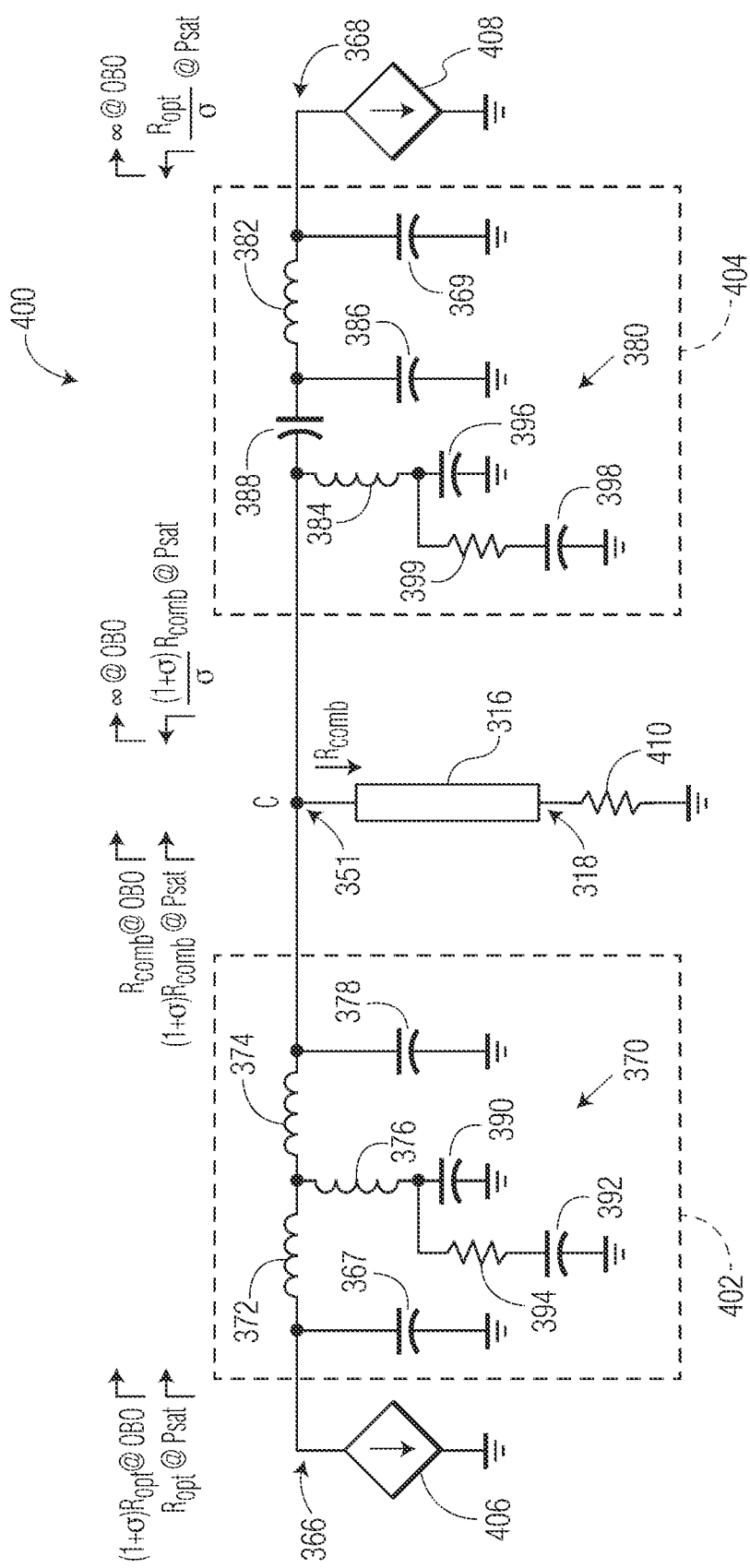
FIG. 4 is a schematic diagram of the improved integrated DPA of FIG. 3, in which interaction of frequency-corrective networks of a combiner circuit of the DPA with other portions of the DPA is illustrated by current source models.

FIG. 4 depicts the DPA 300 in a further schematic representation 400. The further schematic representation 400 again shows the first circuit portion 370 as being coupled between the carrier output port 366 and the combining node 351 (with certain circuit components also being coupled to ground as discussed above), the second circuit portion 380 as being coupled between the peaking output port 368 and the combining node 351 (with certain circuit components also being coupled to ground as discussed above), and the impedance transformer 316 being coupled between the combining node 351 and the RF output port 318. Additionally, the further schematic representation 400 also shows the first parasitic capacitance 367 as being coupled between the carrier output port 366 and ground and the second parasitic capacitance 369 as being coupled between the peaking output port 368 and ground. Although the RF output port 318 may be considered the output terminal of the DPA 300, for purpose of representing operation of the DPA 300 relative to a load coupled to the RF output port 318, FIG. 4 also shows a resistor 410 coupled between the RF output port 318 and ground. The resistor 410 should not be considered to constitute part of the DPA 300, but rather represents a load to which the DPA 300 is coupled.

FIG. 4 also illustrates the DPA 300 in a manner differing from that of FIG. 3 so as to highlight certain aspects of the DPA. First, as illustrated in FIG. 4, the combination of the first circuit portion 370 and the first parasitic capacitance 367 (shown within a first dashed box) is a first frequency-corrective network (or first improved quasi-inverter network) 402. Also, the combination of the second circuit portion 380 and the second parasitic capacitance 369 (shown within a second dashed box) is a second frequency-corrective network 404. Additionally, FIG. 4 illustrates that the circuit portions of the DPA 300 that are coupled to the first frequency-corrective network 402 at the carrier output port 366, including the carrier amplifier 312, may be represented/modeled as a first current source 406. Likewise, FIG. 4 illustrates that the circuit portions of the DPA 300 that are coupled to the second frequency-corrective network 404 at the peaking output port 368, including the peaking amplifier 314, may be represented/modeled as a second current source 408. Thus, the interactions (e.g., current flow, $I_c$) of the first frequency-corrective network 402 relative to the carrier amplifier 312 may be represented by the first current source 406, and the interactions (e.g., current flow, $I_p$) of the second frequency-corrective network 404 relative to the peaking amplifier 314 may be represented by the second current source 408.

Thus, each of FIG. 3 and FIG. 4 illustrates, in first and second schematic forms, respectively, the improved integrated DPA 300 in its entirety, including the improved Doherty combiner circuit 302 (or simply "combiner"). It should be appreciated that, in the embodiment of FIGS. 3 and 4, the combining node 351 (C) is not located at the peaking drain manifold as in the embodiments illustrated in FIGS. 1 and 2, but rather the combining node may be positioned on an integrated passive device (IPD), thus separating the combining node from the peaking drain manifold. In this regard, the IPD may be considered to constitute or include (or to be formed by) one or more portions of the improved Doherty combiner circuit 302 (e.g., the second circuit portion 380, first circuit portion 370, or both of those circuit portions). Also, notwithstanding the description herein of a single IPD, the IPD may in actuality include or encompass more than one IPD or IPD structures. Further it should be appreciated from FIGS. 3 and 4 that the improved Doherty combiner circuit 302 includes both the first frequency-corrective network 402 including the first circuit portion 370 and the first parasitic capacitance 367, and also the second frequency-corrective network 404 including the second circuit portion 380 and the second parasitic capacitance 369. However, in FIG. 3, the combiner circuit 302 is not illustrated as including the first and second parasitic capacitances 367 and 369 because these are not actual physical (or discrete) circuit components, but rather represent parasitic capacitances within the combiner circuit 302 that are concomitant with the arrangement of other components of the circuit.

The first frequency-corrective network 402 on the carrier amplifier 312 side serves as (or includes) a first quasi-inverter network that is formed by (or takes the form of) a low-pass network including the first parasitic capacitance 367, the inductors 372, 374, 376, and the capacitor 378 (that is, a $C_{ds,c}$-$L_{1c}$-$L_{2c}$-$L_{1c}$-$C_{1c}$ low-pass network). Further, the second frequency-corrective network 404 located at the peaking output port 368 on the peaking amplifier 314 side is formed by (or takes the form of) a bandpass network including the second parasitic capacitance 369, the inductors 382 and 384, and the capacitors 386 and 388 (that is, a $C_{ds,p}$-$L_{1p}$-$C_{1p}$-$C_{2p}$-$L_{2p}$ bandpass network).

The values of the various components of the combiner circuit 302 may vary depending upon the embodiment. In one example embodiment, the design parameter $L_{1p}$ is a free variable, and the closed form equations/expressions for determining the design parameters $L_{1c}$, $L_{2c}$, $C_{1c}$, $C_{1p}$, $C_{2p}$, and $L_{2p}$, respectively, of the improved Doherty combiner circuit 302 are as shown in Equations (1) through (6) below, respectively:

$$L_{1c} = \frac{R_{tar}}{\omega_o(1 + \omega_o C_{dsc} R_{tar})} \quad (1)$$

$$L_{2c} = \frac{R_{tar}}{\omega_o\left((\omega_o C_{dsc} R_{tar})^2 - 1\right)} \quad (2)$$

$$C_{1c} = C_{dsc} \quad (3)$$

$$C_{1p} = \frac{1 - \sqrt{\frac{R_1}{R_2}}}{\omega_o^2 L_{1p}} \quad (4)$$

$$C_{2p} = \frac{1}{\omega_o^2 L_{1p}} \sqrt{\frac{R_1}{R_2}} \quad (5)$$

$$L_{2p} = \frac{L_{1p} R_2}{(\omega_o^2 L_{1p} C_{dsp} - 1)R_1 - \sqrt{R_1 R_2}} \quad (6)$$

Further with respect to the Equations (1)-(6), it should be understood that the respective parameters $w_0$, $R_{tar}$, $R_1$, and $R_2$ may be determined as follows in accordance with Equations (7)-(10), respectively:

$$\omega_o = 2\pi f_o \quad (7)$$

$$R_{tar} = \sqrt{(1 + \sigma)R_{opt} R_{comb}} \quad (8)$$

$$R_1 = \frac{R_{opt}}{\sigma} \quad (9)$$

$$R_2 = \frac{(1 + \sigma)R_{comb}}{\sigma} \quad (10)$$

Additionally, with respect to Equations (7)-(10), the design parameter $R_{comb}$ constitutes the impedance looking toward the impedance transformer 316 from the combining node 351 (that is, the combining load impedance looking toward the impedance transformer from the node C), and is a free variable and does not necessarily have a closed form. Further, the respective parameters σ, and $R_{opt}$ may be determined as follows in accordance with Equations (11)-(12), respectively:

$$\sigma = \frac{P_{sat,p}}{P_{sat,c}} \quad (11)$$

$$R_{opt} = \frac{2(V_D - V_k)}{I_{max,c}} \quad (12)$$

In regard to Equations (11)-(12), it should be recognized that $P_{sat,p}$ is the saturated output power of peaking amplifier 314, $P_{sat,c}$ is the saturated output power of carrier amplifier 312, $V_D$ is the drain voltage, $V_k$ is knee voltage, and $I_{max,c}$ is the maximum drain current of the carrier amplifier 312.

Given such component values and the architecture shown in FIGS. 3 and 4, several operational characteristics of the improved DPA 300 are as follows. To begin, a first characteristic impedance of the first frequency-corrective network 402 (and first quasi-inverter network thereof) is $R_{tar}$, which is a function of $R_{comb}$, $R_{opt}$ and σ as shown in Equation (8). The optimum characteristic impedance of the first frequency-corrective network 402 should be $R_{tar}$ with an insertion angle of 90 degrees (λ/4) to present the optimum load conditions. Further, the first frequency-corrective network 402 (and first quasi-inverter network thereof) is designed to present a match between $R_{comb}$ at the combining node 351 and (1+σ)$R_{opt}$ at the $I_c$ plane at the OBO condition. Additionally, at the high (or peak) power or saturation (Psat) condition, the first frequency-corrective network 402 (and first quasi-inverter network thereof) is designed to present a match between (1+σ)$R_{comb}$ at the combining node 351 and $R_{opt}$ at the $I_c$ plane.

Further, as already noted above, the second frequency-corrective network 404 operates as a bandpass circuit, particularly with 0° phase shift at $f_0$. Thus at the OBO condition, the peaking amplifier 314 (which may be a class-C biased peaking amplifier) presents an open circuit condition at the combining node 351 and does not load the carrier amplifier 312. On the other hand, at the saturation condition, the second frequency-corrective network 404 is designed to present a match between ((1+σ)/σ)$R_{comb}$ at the combining node 351 and $R_{opt}$/σ at the $I_p$ plane.

Given the architecture of the improved DPA 300, and particularly the combiner circuit 302, of FIGS. 3 and 4, it should particularly be appreciated that the combining node 351 (C) (and the impedance experienced at that combining node) is not directly correlated to or a direct function of $R_{opt}$ and σ as in the case of integrated Doherty combiners such as those discussed above with respect to FIG. 1 and FIG. 2. Rather, the improved DPA 300, with the combiner circuit 302, offers the flexibility to choose the combining node impedance ($R_{comb}$) independently and may be optimized for both OBO and saturated power conditions for improved bandwidth.

The DPA 300 of FIG. 3 and FIG. 4 may achieve significant bandwidth improvements by comparison with conventional DPAs, not only in terms of radio frequency (RF) bandwidth, but also in terms of instantaneous bandwidth/video bandwidth (VBW) of the DPA. Indeed, the DPA combiner circuit 302 provided by the DPA 300 is a wideband combiner circuit that particularly offers enhanced VBW capability by comparison with conventional DPAs. Typically (in conventional DPAs) any shunt-L fundamental match and the bias line inductance at the output resonate with the drain-source capacitance and cause low frequency gain peaking at baseband frequency. In addition, in a conventional DPA, the gate-source capacitance ($C_{gs}$) of the carrier amplifier may also cause low frequency resonance to limit the VBW of the DPA.

In contrast to such conventional DPAs, the DPA 300 includes several components that operate to improve VBW performance. More particularly, the DPA 300 includes the first combiner resistor 394 and the third combiner capacitor 392 (having the $R_{env}$-$C_{env}$ values as mentioned above) coupled at (or indirectly to) the output port 366 of the carrier amplifier 312, and additionally includes the input circuit portion 358 formed by the third additional inductor 352, first resistor 356, and fourth additional capacitor 354 (having the $L_{env}$-$R_{env}$-$C_{env}$ values as mentioned above) coupled at (or indirectly to) the input port 324 of the carrier amplifier 312. These components—including the first combiner resistor 394, third combiner capacitor 392 and input circuit portion 358—constitute an enhanced VBW network that dampens the magnitude of the low frequency gain and pushes it out to a much higher frequency, for improved VBW performance. The input circuit portion 358 particularly operates as a shunt L+T network that serves to provide a fundamental input pre-match, and thus helps to obtain wide and flat gain response across a range of frequencies. Further, the first additional inductor 342 (with the inductance $L_{2f0}$) and second additional capacitor 344 (with the capacitance $C_{2f0}$) form an input integrated harmonic trap (IHT) network at the carrier input port 324, and this IHT network helps to terminate the input second harmonic (2f0) signal components at an optimum location to improve output back-off (OBO) efficiency.

Figure 5:
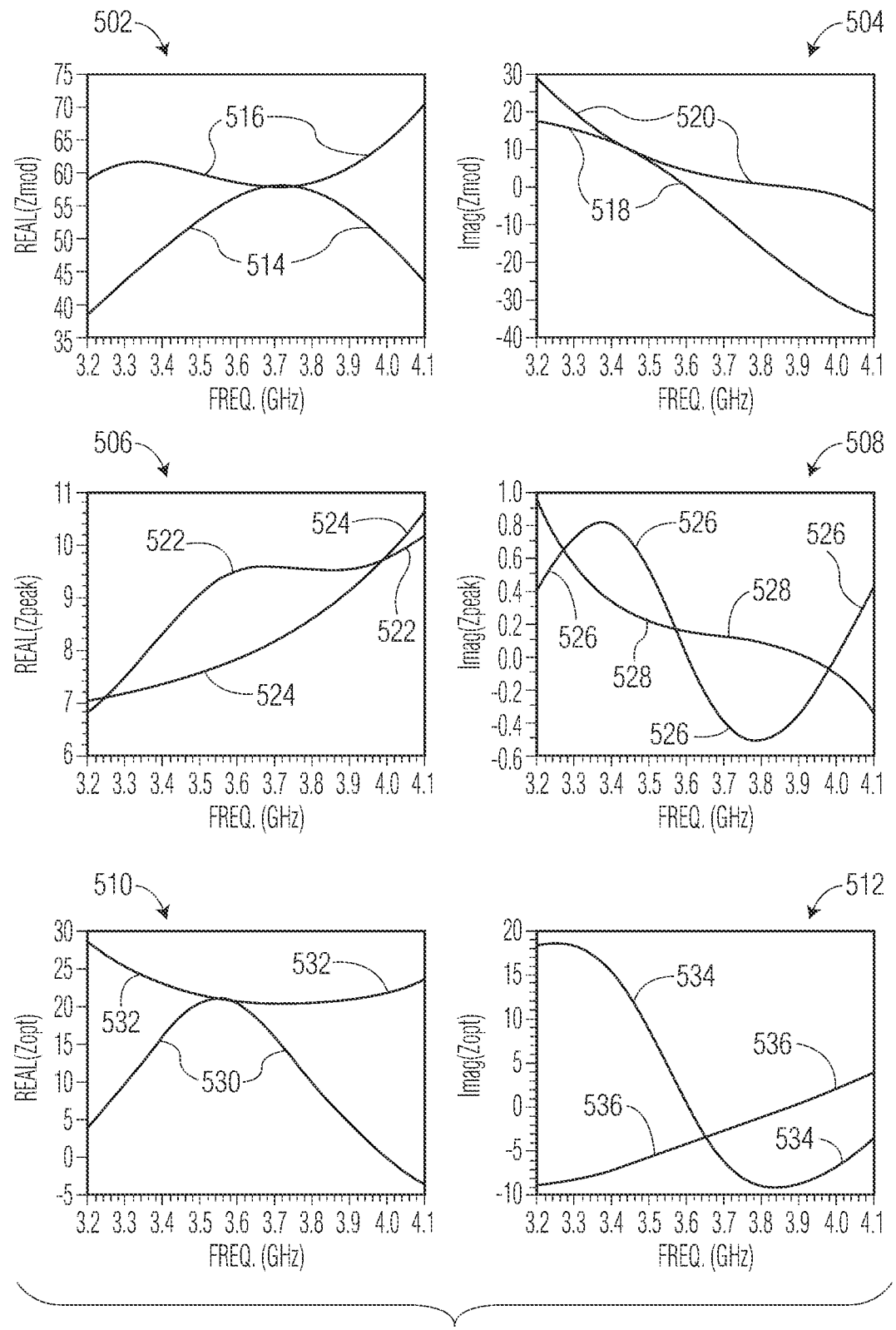
FIG. 5 is a set of graphs illustrating how impedances at output back-off (OBO) and saturated power conditions vary with frequency for an example DPA consistent with the design of FIGS. 3 and 4, relative to a conventional DPA design.

The present disclosure encompasses numerous embodiments of DPAs, including numerous embodiments of the DPA 300 in which the various components have any of a variety of different parameters (or values). Although the particular behavior (including frequency behavior) of any given version of the DPA 300 may vary depending upon the parameters (or values) of the various components of the DPA, numerous such versions of the DPA 300 having such different component parameters may nonetheless provide enhanced performance by comparison with conventional DPAs. In this regard, FIG. 5 is provided to illustrate one example of how one version of the DPA 300 having particular component parameters provides enhanced performance by comparison with a conventional DPA. For purposes of this example, the following design parameters were chosen based upon the assumption that the DPA 300 employs a GaN 5.22 millimeter (mm) carrier device (e.g., power transistor) as the carrier amplifier 312, and employs a 11.02 mm peaking device (e.g., power transistor) as the peaking amplifier 314: $R_{opt}$=19.5 ohms, $R_{mod}$=60 ohms, σ=2.11, $C_{ds,c}$=1.92 pF, and $C_{ds,p}$=4.1 pF.

Further in this regard, FIG. 5 shows first, second, third, fourth, fifth, and sixth graphs 502, 504, 506, 508, 510, and 512, respectively, to provide comparisons of the impedances at Zmod (OBO) and Zopt/Zpeak (saturated power) conditions between the DPA 300 of FIGS. 3 and 4 (with the aforementioned design parameters) relative to a conventional DPA. In this regard, Zmod can be understood to constitute the optimum fundamental output impedance for the carrier amplifier at output back-off (OBO), Zopt can be understood to constitute the optimum fundamental output impedance for the carrier amplifier at saturated power, and Zpeak can be understood to constitute the optimum fundamental output impedance for the peaking amplifier at saturated power. More particularly, the first, third, and fifth graphs 502, 506, and 510 respectively illustrate how the real parts of the impedances at Zmod, Zpeak, and Zopt, respectively, vary over a frequency range of 3.2 to 4.1 GHz, and the second, fourth, and sixth graphs 504, 508, and 512 respectively illustrate how the imaginary parts of the impedances at Zmod, Zpeak, and Zopt, respectively, vary over the frequency range of 3.2 to 4.1 GHz. The respective performances of the conventional DPA in each of the graphs 502, 504, 506, 508, 510, and 512 is shown by respective first curves 514, 518, 522, 526, 530, and 534, respectively, and the respective performances of the DPA 300 of FIGS. 3 and 4 (with the aforementioned design parameters) in each of the graphs 502, 504, 506, 508, 510, and 512 is shown by respective second curves 516, 520, 524, 528, 532, and 536, respectively.

Several operational characteristics that differ between the DPA 300 relative to the conventional DPA are evident from the graphs 502, 504, 506, 508, 510, and 512. In particular, each of the real and imaginary parts of the impedances for the DPA (combiner) 300 as shown by the second curves 516, 520, 524, 528, 532, and 536 experiences small variation across the 3.2-to-4.1 GHz frequency by comparison with the corresponding real and imaginary parts of the impedances for the conventional DPA (combiner) as shown by the first curves 514, 518, 522, 526, 530, and 534. The conventional DPA particularly exhibits sharp-roll offs for the real parts of the impedances at low and high frequencies (especially for the Zmod and Zopt impedances) by comparison with the DPA 300, which exhibits relatively more constant real parts of those impedances. Also, the conventional DPA exhibits relatively wide variations in the imaginary parts of the impedances across the 3.2-to-4.1 GHz frequency band by comparison with the lesser variations in the imaginary parts of those impedances experienced by the DPA 300 across that frequency band. It should be recognized that, by keeping variation of the real and imaginary parts of the impedances Zmod, Zpeak, and Zopt relatively small (especially the real parts) over this wide frequency range, the DPA 300 achieves significantly improved bandwidth relative to the conventional DPA.

Figure 6:
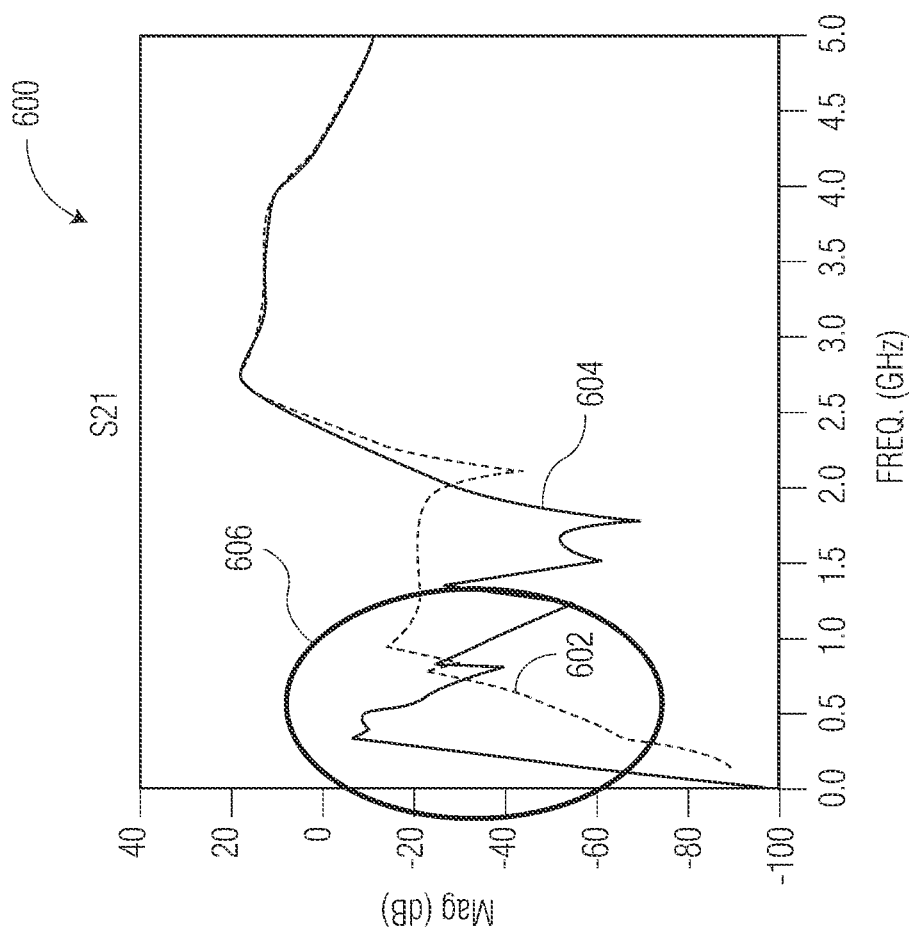
FIG. 6 is a graph illustrating example wideband S-parameter characteristics (particularly for the S21 S-parameter) both for an example DPA having a video bandwidth (VBW) network consistent with the design of FIGS. 3 and 4, and also for a modified DPA that lacks that VBW network.

Turning to FIG. 6, a graph 600 is provided to illustrate how VBW performance of the DPA 300 is enhanced by the presence of the VBW network described above (having the resistor 394, capacitor 392, inductor 352, resistor 356, and capacitor 354 with the $R_{env}$-$C_{env}$ values and the $L_{env}$-$R_{env}$-$C_{env}$ values as mentioned above). More particularly, the graph 600 shows example S-parameter characteristics for the DPA 300 to illustrate the wideband S-parameter performance of the combiner circuit 302 with the VBW network in place, and also with that DPA modified so that the VBW network is absent (e.g., with the resistor 394, capacitor 392, inductor 352, resistor 356, and capacitor 354 being taken out).

More particularly, the graph 600 illustrates the variation of magnitude (in dB) with frequency (from 0 to 5 GHz) for the S21 S-parameter. As shown, the graph 600 includes a first curve 602 that shows performance of the combiner circuit 302 when the VBW network is in place, and also includes a second curve 604 that shows performance of the combiner circuit if modified so that the VBW network is absent.

Further, the graph 600 shows how the magnitude-related performance of the DPA particularly is enhanced by the presence of the VBW network. As shown within a region 606 of the graph 600, the low frequency gain magnitude at 500 MHz in the DPA 300 having the VBW network as illustrated by the first curve 602 is lower by almost 20 dB relative to the frequency gain magnitude at 500 MHz in the DPA circuit not having the VBW network as illustrated by the second curve 604. The presence of the VBW network in the DPA 300 has the effect of pushing out the low frequency gain magnitude to around 940 MHz (in general, higher low-frequency gain peaking corresponds to better VBW performance). Such operation made possible by the presence of the VBW network ultimately enhances the digital pre-distortion (DPD) linearizability of the DPA for broader bandwidth modulated (e.g., Long-Term Evolution or LTE) signals.

As will be appreciated from the example characteristics shown in FIG. 5 and FIG. 6, it should be appreciated that the DPA 300 in one example embodiment may achieve P3-dB saturated power of 51.9 dBm within or over a frequency range of 3.4-3.8 GHz. Also, in such an example embodiment, input return loss may be approximately −15 dB, and gain and drain efficiency at 8.5 dB OBO may be 15-15.3 dB and 60-61% respectively, with AM/PM being limited to −15° only across the band. Further, in such an example embodiment, overall the performance may be flat with small variations as expected, and the impedances at OBO and saturated power conditions are tight and close to the real axis. With small changes on the OMN (output matching network) and IMN in the printed circuit board (PCB), the amplifier may be tuned to obtain flat performance even across 3.3-3.8 GHz. Thus, embodiments of the DPAs and associated combiner circuits encompassed herein may achieve a wideband capability. Further, it should be appreciated that by designing multi-section matching networks (rather than simple PCB matches being employed for the IMN and OMN), the amplifier bandwidth may be further widened.

Figure 7:
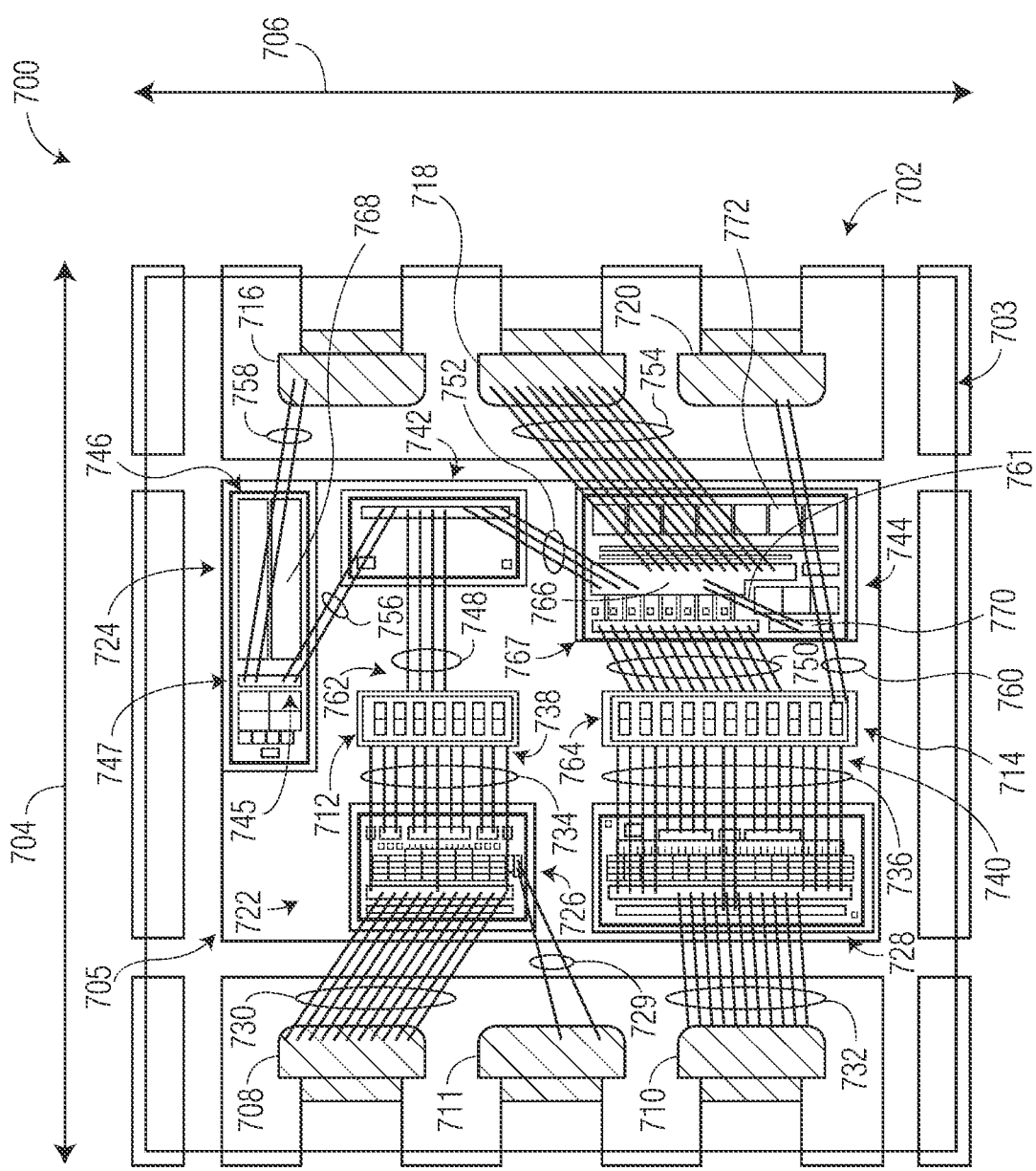
FIG. 7 is a top view of a Doherty amplifier module (or bonding diagram) showing an example implementation of components arranged on a semiconductor package and forming an example embodiment of the DPA of FIG. 3.

Turning next to FIG. 7, a top view of an example of a packaged RF amplifier device 700 is illustrated. The packaged RF amplifier device 700 is provided to show an example implementation of components arranged as a semiconductor device package (or simply semiconductor package) 702 that form an example embodiment of portions of the DPA 300 of FIG. 3 (also represented by FIG. 4). The components shown in the device 700 particularly include the components shown within the dashed box 301 of FIG. 3, including the combiner circuit 302 shown in FIG. 3. When incorporated into a larger electrical system, the device 700, would be mounted on a printed circuit board (PCB), which is not shown.

A package outline 703 shown in FIG. 3 is a boundary of a plastic mold compound of the semiconductor package 702. Accordingly, device 700 is an encapsulated device. In other embodiments, device 700 may be implemented in an air-cavity package. In the present embodiment, the semiconductor package 702 includes a package flange 705, which is a rigid electrically-conductive substrate formed from a solid conductive material, and which has a thickness that is sufficient to provide structural support for electrical components and elements of the device 700. In addition, the package flange 705 may function as ground reference node and a heat sink for the amplifier dies and other devices mounted on the flange.

In this example embodiment, the semiconductor package 702 is a PDFN (power dual flat, no-lead) 7.2×6.7 mm (or, 7×6.5 mm) rectangular semiconductor package. As an example, a first dimension 704 of the semiconductor package 702 is 7.2 mm and a second dimension 706 (perpendicular to the first dimension) of the semiconductor package is 6.7 mm. In the present example implementation illustrated by the device 700, the DPA 300 (including input-prematching and the combiner circuit) houses all but the input splitter and out-of-package portions of input impedance networks of a Doherty power amplifier. Several semiconductor dies, bond wires, and integrated passive devices (IPDs) are included as parts of the semiconductor package 702, as described in further detail below.

It will be appreciated that the semiconductor package 702 illustrates a final (single) stage design in which each amplification path includes a single integrated circuit (IC) die 712, 714 coupled to the top surface of the substrate 703 (and more particularly the flange 705), rather than a multi-stage design. Nevertheless, the present disclosure is intended to encompass additional or alternate embodiments in which portions of DPAs are implemented on other types of semiconductor packages or in other manners. For example, in some alternate embodiments, portions of DPAs may be implemented on other types of dual flat, no-lead (DFN) semiconductor packages, or quad flat, no-leads (QFN) semiconductor packages, or 6-lead high-power packages, or on small circuit boards. Also, in some alternate embodiments, the semiconductor package 702 can entail a multi-stage design, for example, in which each amplification path includes both a driver stage IC die and a final stage IC die physically connected to the top surface of the substrate 703.

More particularly, FIG. 7 shows that the semiconductor package 702 includes first and second input lands (or pads, leads, pins, terminals, or ports) 708 and 710, respectively, which are electrically isolated from the flange 705. The first and second input lands 708 and 710 respectively may be coupled to the first output port 322 of the first IMN 308 and to the second output port 332 of the second IMN 310, respectively, as described in regard to FIG. 3 (but which are not shown in FIG. 7), and may receive first and second RF input signals, respectively. The first RF input signal received at the first input land 708 is suited for the carrier amplifier 312 (e.g., RFin_C/VG_C) and the second input signal received at the second input land 710 is suited for the peaking amplifier 314 (e.g., RFin_P/VG_P) of the combiner circuit 302. An additional input land 711 is also shown to be provided on the semiconductor package 702 in between the first and second input lands 708 and 710. In the illustrated embodiment, the additional input land 711 enables the VBW circuit of FIG. 3 to be implemented partially in package, and partially out of package (e.g., inductor 352 corresponds to bond wires 729, and resistor 356 and capacitor 354 are coupled outside the package to input land 711). In an alternate embodiment, the VBW circuit (including each of the inductor 352, capacitor 354, and resistor 356) can be fully implemented on the package.

Further as shown in FIG. 7, the semiconductor package 702 includes a carrier amplifier die 712 and a peaking amplifier die 714 that respectively correspond to the carrier amplifier 312 and peaking amplifier 314 of FIG. 3, respectively. Each of the carrier amplifier die 712 and peaking amplifier die 714 includes one or more power transistors (e.g., FETs, such as GaN HEMT FETs or other types of transistors). Also, the semiconductor package 702 includes first, second, and third output lands (or pads, leads, pins, terminals, or ports) 716, 718, and 720. In the present example embodiment, the second output land 718 is the output site at which RF output signals are output by the semiconductor package 702. The second output land 718 is electrically coupled to a combining node 766 (e.g., corresponding to the combining node 351 of FIG. 3), which may be implemented as a bond pad on an IPD 744. Outside the package, the second output land 718 may be coupled the impedance transformer 316 (see FIG. 3 and FIG. 4) and, at least indirectly, a load such as the resistor 410 (see FIG. 4). By comparison, the first and third output lands 716 and 720 respectively may be coupled to carrier drain bias voltage and peaking drain bias voltage signals, respectively (e.g., Vd_C and Vd_P, respectively), and may be considered bias lands. Such bias lands may be coupled to external bias circuitry or bias voltage sources, to receive drain (or gate) bias voltages, and to convey the bias voltages to circuitry internal to the device 700.

Additionally, the semiconductor package 702 further includes input side circuitry 722 by which the carrier amplifier die 712 and peaking amplifier die 714 are coupled to the input lands 708 and 710, and output side circuitry 724 by which the carrier amplifier die and peaking amplifier die are coupled to the output lands 716, 718, and 720. The input side circuitry 722 and the output side circuitry 724 each include multiple IPDs 726, 728, 742, 744, 746 and a plurality of bond wires (or sets or arrays of bond wires, each of which may include one or more bond wires). The bond wires serve to couple the input and output side IPDs 726, 728, 742, 744, 746 to the carrier and peaking amplifier dies 712 and 714 and to the input and output lands 708, 710, 716, 718, and 720. Each of the sets of bond wires corresponds to an inductance in the Doherty amplifier. In the present embodiment, all of the dies and IPDs—including each of the carrier and peaking amplifier dies 712 and 714, input side IPDs 726, 728, and output side IPDs 742, 744, 746—are mounted on the package flange 705 by a good thermally conductive die-attach material.

An IPD essentially includes a distinct substrate (e.g., a semiconductor substrate) that includes one or more integrally-formed passive electronic components (e.g., integrally-formed inductors, capacitors, and/or resistors), along with bond pads and conductive routing that enables outside circuitry (e.g., transistor dies 712, 714) to be electrically connected to the integrated passive components within the IPD. In the present example embodiment, for example, capacitors corresponding to the capacitors 344, 348, 364, 390, 392, 378, 386, 388, 396, and 398, inductors corresponding to the inductors 342, 346, 362, and 376, and resistors corresponding to the resistors 394, 399 may be integrally formed within the IPDs 726, 728, 742, 744, 746. A ground reference node (e.g., a conductive layer) on the bottom surface of each IPD may serve as a ground node for passive components integrated within the IPD (e.g., to ground one terminal of each of capacitors 344, 348, 364, 390, 392, 378, 386, 396, and 398).

The input side circuitry 722 particularly includes first and second IPDs 726, 728, in an embodiment, which could be combined into a single elongated IPD, in an alternate embodiment. The first input side IPD 726 includes integrated components corresponding to capacitors 344 and 348 (FIG. 3). As mentioned above, in an embodiment in which the VBW circuit is implemented in the package 702, the first input side IPD 726 also may include the VBW circuit inductance 352, resistor 356, and capacitor 354. The second input side IPD 728 includes integrated components corresponding to capacitor 364 (FIG. 3).

First, second, third, and fourth sets of bond wires (or bond wires, bonding wires, or wire bonds) 730, 732, 734, and 736, respectively, electrically couple the input lands 708, 710, input side IPDs 726, 728, and dies 712, 714. The first and second sets of bond wires 730 and 732 (corresponding to the inductors 325 and 335, respectively, of FIG. 3) respectively couple the first and second input lands 708 and 710, respectively, with capacitors (e.g., capacitors 340, 360, FIG. 3) within the first and second input side IPDs 726 and 728, respectively. The third set of bond wires 734 (corresponding to the inductors 326, 342, 346, FIG. 3) couples the carrier input port 738 of the carrier amplifier die 712 (which corresponds to the carrier input port 324 of FIG. 3) to capacitors (e.g., capacitors 344, 348, FIG. 3) within the first IPD 726. Similarly, the fourth set of bond wires 736 (corresponding to inductances 336, 362, FIG. 3) couples the peaking input port 740 of the peaking amplifier die 714 (which correspond to the peaking input port 334 of FIG. 3), to capacitors (e.g., capacitors 360, 364, FIG. 3) within the second IPD 728. Also, as mentioned above, to provide a VBW circuit, a further set of bond wires 729 couples the first input side IPD 726 with the additional input land 711 (this set of bond wires may be understood as constituting the third additional inductor 352 having the inductance $L_{env}$). The passive components within the first input side IPD 726, first set of bond wires 730, third set of bond wires 734, and further set of bond wires 729 may generally be understood to correspond to the first intermediate circuit 328 of FIG. 3. The passive components within the second input side IPD 728, second set of bond wires 732, and fourth set of bond wires 736 may generally be understood to correspond to the second intermediate circuit 338 of FIG. 3.

The output side circuitry 724 particularly includes a first output side IPD 742, a second output side IPD 744, and a third output side IPD 746, as well as first, second, third, fourth, fifth, sixth, seventh, and eighth additional sets of bond wires 748, 750, 752, 754, 756, 758, 760, and 761, respectively. The first output side IPD 742 includes the first intermediate node 379 (FIG. 3), which is implemented as a bond pad at the top surface of the first output side IPD 742. The second output side IPD 744 includes the combining node 766 (e.g., corresponding to the combining node 351, FIG. 3) in the form of a bond pad at the top surface of the second output side IPD 744. An additional bond pad 767 at the top surface of the second output side IPD 744, to which bond wires 750 are coupled, may be considered to correspond to the second intermediate node 389 of FIG. 3. In addition, the second output side IPD 744 includes integrated components corresponding to capacitors 378, 386, 388, 396, 398, inductor 384, and resistor 399 (FIG. 3). The third output side IPD 746 includes integrated components corresponding to capacitor 390, resistor 394, and capacitor 392 (FIG. 3).

The first additional and second additional sets of bond wires 748 and 750 respectively couple the first and second output side IPDs 742 and 744, respectively, with carrier output port 762 of the carrier amplifier die 712 (which corresponds to the carrier output port 366 of FIG. 3) and peaking output port 764 of the peaking amplifier die 714 (which corresponds to the peaking output port 368 of FIG. 3), respectively. The first additional set of bond wires 748 may be understood to serve as the first combiner inductor 372 (with inductance $L_{1c}$) of FIG. 3, and the second additional set of bond wires 750 may be understood to serve as the fourth combiner inductor 382 (with inductance $L_{1p}$) of FIG. 3. Further in this regard, as noted above, the second output side IPD 744 includes an integrated component corresponding to the fifth combiner capacitor 388. It is by way of this integrated component corresponding to the fifth combiner capacitor 388 that the second additional set of bondwires 750 forming the fourth combiner inductor 382 are coupled to the combining node 766, which (as noted above) is also provided on the second output side IPD 744.

Additionally, the third additional set of bond wires 752 couples the first output side IPD 742 (or node 379, FIG. 3) to the combining node 766 on the second output side IPD 744, and that set of bond wires may be understood to serve as the second combiner inductor 374 (with inductance $L_{1c}$). Also, the fourth additional set of bond wires 754 (corresponding to inductor 345, FIG. 3) couples the combining node 766 on the second output side IPD 744 to the second output land 718. In this manner, the carrier output ports 762 of the carrier amplifier die 712 are coupled to the combining node 766 particularly by way of the first additional and third additional sets of bond wires 748 and 752, and additionally coupled to the second output land 718 by way of the fourth additional set of bond wires 754. Further, the peaking output port 764 of the peaking amplifier die 714 is coupled to the second output land 718 particularly by way of the second additional set of bond wires 750, capacitor 388 (FIG. 3) implemented in the second output side IPD 744, the combining node 766 of the second output side IPD 744, and the fourth additional set of bond wires 754 (corresponding to inductor 345, FIG. 3).

Further as shown, the fifth additional set of bond wires 756 (corresponding to inductor 376, FIG. 3) links the first output side IPD 742 (and more particularly the intermediate node 379, FIG. 3) to a first bond pad 745 on the third output side IPD 746, and the sixth additional set of bond wires 758 link the first bond pad 745 on the third output side IPD 746 with the first output land 716. The first bond pad 745 is coupled to the first combiner (series-coupled) resistor 394 and the third combiner capacitor 392 (having the capacitance $C_{env}$), which are integrally formed within the third output side IPD 746. Thus, the first output side IPD 742, and more particularly the first intermediate node 379, is coupled to the first output land 716 at which is applied to the carrier drain voltage signal by way of (at least) the fifth additional set of bond wires 756, the first bond pad 745, and the sixth additional set of bond wires 758.

In addition, it should also be appreciated that the peaking output port 764 is coupled to the third output land 720 by way of the seventh additional set of bond wires 760. A peaking drain voltage signal is applied to the peaking output port 764 by way of the third output land 720 and the seventh additional set of bond wires 760. Further, FIG. 7 also shows that eighth additional set of bond wires 761 (which in this example only includes two bond wires) couples an additional bond pad that is coupled to the capacitor 388, which is integrally formed within the second output side IPD 744, to another additional bond pad, which is coupled to capacitor 396 and resistor 399, which also are integrally formed within the second output side IPD 744. As mentioned previously, capacitor 398, which also is coupled to resistor 399, also is internal to the second output side IPD 744, The eighth additional set of bond wires 761 may be understood to serve as the fifth combiner inductor 384 shown in FIG. 3 (having the inductance $L_{2p}$).

Embodiments encompassed by the present disclosure may provide any one or more of a variety of advantages. In at least some embodiments, the present disclosure relates to embodiments of DPAs in which an output combiner is fully (or at least partially) integrated with other portions of the DPA such as the carrier and peaking amplifiers, and thereby achieves DPA footprint reduction. Also, in at least some embodiments, the present disclosure envisions an improved integrated Doherty combiner architecture that includes a frequency corrective network and that offers enhanced bandwidth performance by comparison with conventional combiners. In at least some such embodiments, the improved integrated Doherty combiner architecture achieves enhanced bandwidth performance both in terms of RF bandwidth and instantaneous bandwidth/VBW enhancement. More particularly, in addition to enhanced RF bandwidth performance, in at least some embodiments encompassed herein, an improved Doherty combiner architecture achieves a VBW improvement feature that may also make the DPA amicable to linearize with 300-400 MHz wide multi-carrier modulated (e.g., LTE) signaling in the presence of digital predistortion (DPD).

A variety of performance characteristics and behavior may be achieved depending upon the particular component selections, design parameters, and other design characteristics that employed in any given embodiment. At least some embodiments encompassed herein offer more flexibility for combining node impedance choice/selection by moving the combining node to an IPD from the peaking drain manifold. Further, in at least some embodiments, the improved integrated Doherty combiner is compact and may be integrable inside a package, for example, by using bond wires and IPDs. Additionally, at least some embodiments or low loss in terms of power usage or loss, and may be implemented using high Q bond wires, MIM-Caps and/or other types of capacitors.

The present disclosure encompasses embodiments for use in or with products targeted for discrete massive-MIMO base stations for improved performance, and/or module products for wideband applications. The various embodiments may be used in other types of systems, as well.

In at least one example embodiment, the present disclosure relates to a circuit for implementation as part of a Doherty power amplifier (DPA). The circuit includes a first circuit portion coupled between a first input node operable to be coupled to a carrier output node of a carrier amplifier and a combining node configured to serve as, or to be coupled at least indirectly to, a radio frequency (RF) output terminal of the DPA. The first circuit portion includes first, second, and third inductive components, wherein the first inductive component is coupled between the first input node and a first intermediate node, the second inductive component is coupled between the first intermediate node and the combining node, and the third inductive component is coupled between the first intermediate node and a first additional node. Additionally, the circuit also includes a second circuit portion coupled between a second input node configured to be coupled to a peaking output node of a peaking amplifier and the combining node. The second circuit portion includes a fourth inductive component, a first capacitive component, and a second capacitive component, wherein the fourth inductive component is coupled between the second input node and a second intermediate node, the first capacitive component is coupled between the second intermediate node and the combining node, and the second capacitive component is coupled between the second intermediate node and a second additional node, whereby the second circuit portion is positioned between the combining node and a peaking drain manifold of the peaking amplifier.

Further, in at least one example embodiment, the present disclosure relates to a Doherty power amplifier (DPA) device. The DPA includes a carrier amplifier die having a first transistor with a carrier output terminal at which a first amplified signal is generated, and a peaking amplifier die having a second transistor with a peaking output terminal at which a second amplified signal is generated. Also, the DPA includes an output combining network including at least one first integrated passive device (IPD) coupled between a combining node and each of the carrier and peaking output terminals. The at least one output side IPD includes a first IPD, a second IPD, and a third IPD. Also, the first IPD is coupled to the carrier output terminal by way of a first set of bond wires, and the second IPD includes the combining node and is coupled to the peaking output terminal and to the first IPD by way of second and third sets of bond wires, respectively. Further, the first IPD is additionally coupled to the third IPD by way of a fourth set of bond wires, the second IPD includes a capacitive portion having a capacitance, with the second set of bond wires being connected to the combining node by way of the capacitive portion, and each of the first, second, third, and fourth sets of bond wires includes a respective inductance.

Also, in at least one additional example embodiment, the present disclosure relates to a system. The system includes a first transistor device operable as a carrier amplifier, and a second transistor device operable as a peaking amplifier. Also, the system includes at least one first integrated passive device (IPD) coupled between a combining node and each of a carrier amplifier output port of the first transistor device and a peaking amplifier output port of the second transistor device. Further, the system includes a first frequency-corrective network coupling the carrier amplifier output port with the combining node, where the first frequency-corrective network is formed at least in part by the at least one first IPD and is configured to operate as a first quasi-inverter network that includes a low-pass network. Additionally, the system also includes a second frequency-corrective network coupling the peaking amplifier output port with the combining node, where the second frequency-corrective network is formed at least in part by the at least one first IPD and includes a bandpass network.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A circuit for implementation as part of a Doherty power amplifier (DPA), the circuit comprising:
a first circuit portion coupled between a first input node operable to be coupled to a carrier output node of a carrier amplifier and a combining node configured to serve as, or to be coupled at least indirectly to, a radio frequency (RF) output terminal of the DPA,
wherein the first circuit portion includes first, second, and third inductive components, wherein the first inductive component is coupled between the first input node and a first intermediate node, the second inductive component is coupled between the first intermediate node and the combining node, and the third inductive component is coupled between the first intermediate node and a first additional node;
a second circuit portion coupled between a second input node configured to be coupled to a peaking output node of a peaking amplifier and the combining node,
wherein the second circuit portion includes a fourth inductive component, a first capacitive component, and a second capacitive component, wherein the fourth inductive component is coupled between the second input node and a second intermediate node, the first capacitive component is coupled between the second intermediate node and the combining node, and the second capacitive component is coupled between the second intermediate node and ground, whereby the second circuit portion is positioned between the combining node and a peaking drain manifold of the peaking amplifier.

2. The circuit of claim 1, wherein the first circuit portion is a first frequency-corrective network and additionally includes a first parasitic capacitor, and the second circuit portion is a second frequency-corrective network and additionally includes a second parasitic capacitor.

3. The circuit of claim 2, wherein the first frequency-corrective network is configured to operate as a first quasi-inverter network that is a low-pass network, and wherein the second frequency-corrective network is configured to operate as bandpass network.

4. The circuit of claim 1, wherein the second circuit portion additionally includes a fifth inductive component coupled between the combining node and a second additional node.

5. The circuit of claim 4, wherein each of the first, second, third, fourth, and fifth inductive components is formed by a respective set of one or more bond wires.

6. The circuit of claim 4, wherein the first circuit portion also includes a third capacitive component coupled between the combining node and ground.

7. The circuit of claim 6,
wherein the first circuit portion includes a first additional capacitive component, a second additional capacitive component, and a first resistive component, wherein the first additional capacitive component is coupled between the first additional node and ground, and wherein the second additional capacitive component and the first resistive component are coupled in series with one another also between the first additional node and ground, and
wherein the second circuit portion includes a third additional capacitive component, a fourth additional capacitive component, and a second resistive component, wherein the third additional capacitive component is coupled between the second additional node and ground, and wherein the fourth additional capacitive component and the second resistive component are coupled in series with one another also between the second additional node and ground.

8. The circuit of claim 1, wherein each of the first circuit portion, the second circuit portion, and the combining node are positioned at least in part on at least one integrated passive device (IPD).

9. The circuit of claim 1, further comprising the carrier amplifier and the peaking amplifier, and additionally each of:
a first intermediate circuit including a first further inductive component configured to be at least indirectly coupled between a first intermediate matching network and a carrier input port of the carrier amplifier, and
a second intermediate circuit including a second further inductive component configured to be at least indirectly coupled between a second intermediate matching network and a peaking input port of the peaking amplifier.

10. The circuit of claim 9,
wherein the first intermediate circuit includes a third further inductive component coupled between the carrier input port and a third intermediate node, and
wherein the first intermediate circuit also includes a fourth further inductive component, a first further capacitive component, and first further resistive component coupled in series between the third intermediate node and ground and that constitute at least a portion of an enhanced video bandwidth (VBW) network.

11. A Doherty power amplifier (DPA) device, comprising:
a carrier amplifier die having a first transistor with a carrier output terminal at which a first amplified signal is generated;
a peaking amplifier die having a second transistor with a peaking output terminal at which a second amplified signal is generated; and
output side circuitry including at least one integrated passive device (IPD) coupled between a combining node and each of the carrier and peaking output terminals,
wherein the at least one IPD includes a first IPD, a second IPD, and a third IPD,
wherein the first IPD is coupled to the carrier output terminal by way of a first set of bond wires,
wherein the second IPD includes a bond pad, the combining node, and a first capacitor coupled between the bond pad and the combining node, wherein the bond pad is coupled to the peaking output terminal by way of a second set of bond wires, and the combining node is coupled to the first IPD by way of a third set of bond wires,
wherein the first IPD is additionally coupled to the third IPD by way of a fourth set of bond wires,
wherein the second set of bond wires is connected to the combining node by way of the first capacitor, and
wherein each of the first, second, third, and fourth sets of bond wires includes a respective inductance.

12. The DPA device claim 11, wherein the second IPD further includes a second capacitor an additional set of bond wires that couples the first capacitor of the second IPD with the second capacitor of the second IPD, wherein the additional set of bond wires includes a further inductance, and wherein the third IPD includes a third capacitor.

13. The DPA device of claim 11, further comprising a fourth IPD, a fifth IPD, and fifth and sixth sets of bond wires, wherein the fifth set of bond wires couple the fourth IPD with at least one carrier input port of the carrier amplifier die, and the sixth set of bond wires couple the fifth IPD with and at least one peaking input port of the peaking amplifier die.

14. The DPA device of claim 13, further comprising a substrate and a flange, wherein each of the carrier amplifier die, peaking amplifier die, and first, second, third, fourth, and fifth IPDs is mounted at least indirectly upon the substrate.

15. The DPA device of claim 14, further comprising:
first and second input lands coupled to the fourth and fifth IPDs, respectively, and additionally operable to be coupled to a first input matching network (IMN) and a second IMN, respectively, for receiving first and second RF input signals, respectively; and
an output land at which RF output signals are output, wherein the output land is coupled to the combining node.

16. The DPA device of claim 15,
wherein each of the carrier amplifier die, peaking amplifier die, first, second, third, fourth, and fifth IPDs, first and second input lands, and output land are included as portions of a semiconductor package, wherein the semiconductor package is a power dual flat, no-lead (PDFN) semiconductor package, and wherein each of the first transistor of the carrier amplifier die and the second transistor of the peaking amplifier die is a respective GaN power transistor device.

17. A DPA comprising the DPA device of claim 15, further comprising:

the first IMN, the second IMN, a splitter, and an impedance transformer, wherein the first IMN is coupled between the splitter and the first input land, the second IMN is coupled between the splitter and the second input land, the splitter is coupled between a RF input port and each of the first IMN and the second IMN, and the impedance transformer is coupled between the output land and a RF output port.

18. A system comprising:

a first transistor device operable as a carrier amplifier;

a second transistor device operable as a peaking amplifier;

at least one first integrated passive device (IPD) coupled between a combining node and each of a carrier amplifier output port of the first transistor device and a peaking amplifier output port of the second transistor device, wherein the system includes a first frequency-corrective network coupling the carrier amplifier output port with the combining node, wherein the first frequency-corrective network is formed at least in part by the at least one first IPD and is configured to operate as a first quasi-inverter network that includes a low-pass network, and wherein the system also includes a second frequency-corrective network coupling the peaking amplifier output port with the combining node, wherein the second frequency-corrective network is formed at least in part by the at least one first IPD and includes a bandpass network.

19. The system of claim 18, further comprising:

an impedance transformer coupled between the combining node and a radio-frequency (RF) output port;

a splitter;

at least one second IPD;

a first input matching network (IMN) and a second IMN, wherein the first IMN is coupled between the splitter and a carrier amplifier input port, wherein the second IMN is coupled between the splitter and a peaking amplifier input port, and wherein the splitter is coupled between a RF input port and each of the first and second IMNs.

20. A method of amplification by way of Doherty power amplifier (DPA) provided by the system of claim 19, wherein the method includes:

receiving a RF input signal at the RF input port;

first amplifying a first intermediate signal based at least indirectly upon the RF input signal by way of the carrier amplifier to generate a first amplified signal;

second amplifying a second intermediate signal based at least indirectly upon the RF input signal by way of the peaking amplifier to generate a second amplified signal;

combining the first and second amplified signals by way of a combiner circuit including the first frequency-corrective network and the second frequency-corrective network so as to generate a first combined amplified signal at the combining node; and outputting a RF output signal at the RF output port.

* * * * *